United States Patent
Sivan et al.

(10) Patent No.: US 12,132,486 B2
(45) Date of Patent: Oct. 29, 2024

(54) SYSTEM AND METHOD FOR PULSE GENERATION DURING QUANTUM OPERATIONS

(71) Applicant: Quantum Machines, Tel Aviv (IL)

(72) Inventors: Itamar Sivan, Tel Aviv (IL); Yonatan Cohen, Tel Aviv (IL); Nissim Ofek, Tel Aviv (IL); Nir Halay, Tel Aviv (IL); Ori Weber, Tel Aviv (IL)

(73) Assignee: Quantum Machines (IL)

( * ) Notice: Subject to any disclaimer, the term of this patent is extended or adjusted under 35 U.S.C. 154(b) by 842 days.

(21) Appl. No.: 17/225,651

(22) Filed: Apr. 8, 2021

(65) Prior Publication Data
US 2022/0329237 A1 Oct. 13, 2022

(51) Int. Cl.
*H03K 3/38* (2006.01)
*G06N 10/00* (2022.01)
*H03K 5/19* (2006.01)

(52) U.S. Cl.
CPC .............. *H03K 3/38* (2013.01); *G06N 10/00* (2019.01); *H03K 5/19* (2013.01)

(58) Field of Classification Search
CPC .. H03K 3/38; H03K 5/19; H03K 5/08; G06N 10/00; G06N 10/20; G06N 10/40; H03D 7/00
See application file for complete search history.

(56) References Cited

U.S. PATENT DOCUMENTS

| | | |
|---|---|---|
| 4,875,484 A | 10/1989 | Anzai et al. |
| 5,063,354 A | 11/1991 | Lauper et al. |
| 5,194,907 A | 3/1993 | Hayashi |
| 6,223,228 B1 | 4/2001 | Ryan et al. |
| 6,426,984 B1 | 7/2002 | Perino et al. |
| 6,993,108 B1 | 1/2006 | Chi et al. |
| 7,451,292 B2 | 11/2008 | Routt |
| 7,535,931 B1 | 5/2009 | Zampetti et al. |
| 7,627,126 B1 | 12/2009 | Pikalo |
| 8,315,969 B2 | 11/2012 | Roetteler |
| 8,385,878 B2 | 2/2013 | Rao |
| 8,750,717 B1 | 6/2014 | Yap et al. |
| 9,207,672 B2 | 12/2015 | Williams |
| 9,400,499 B2 | 7/2016 | Williams |
| 9,509,324 B2 | 11/2016 | McDonald et al. |
| 9,663,358 B1 | 5/2017 | Cory et al. |
| 9,692,423 B2 | 6/2017 | McDermott, III |

(Continued)

FOREIGN PATENT DOCUMENTS

| | | |
|---|---|---|
| CA | 2420022 | 2/2003 |
| CN | 1808103 A | 7/2006 |

(Continued)

OTHER PUBLICATIONS

U.S. Appl. No. 62/294,966, filed Feb. 12, 2016.

(Continued)

*Primary Examiner* — Jung Kim
(74) *Attorney, Agent, or Firm* — McAndrews, Held & Malloy, Ltd.

(57) ABSTRACT

A pulse generation circuit in a quantum controller operates synchronously with a pulse computation circuit. The pulse generation circuit generates a pulse associated with a quantum element operation. The pulse computation circuit is able to determine characteristics of a signal that is based on the pulse. These characteristics are used by the pulse generation circuit to modify the pulse.

20 Claims, 4 Drawing Sheets

(56) References Cited

U.S. PATENT DOCUMENTS

| | | |
|---|---|---|
| 9,847,121 B2 | 12/2017 | Frank |
| 9,858,531 B1 | 1/2018 | Monroe |
| 9,892,365 B2 | 2/2018 | Rigetti |
| 9,978,020 B1 | 5/2018 | Gambetta |
| 9,979,400 B1 | 5/2018 | Sete |
| 9,996,801 B2 | 6/2018 | Shim |
| 10,063,228 B2 | 8/2018 | Deurloo et al. |
| 10,122,351 B1 | 11/2018 | Naaman |
| 10,127,499 B1 | 11/2018 | Rigetti |
| 10,192,168 B2 | 1/2019 | Rigetti |
| 10,223,643 B1 | 3/2019 | Bishop et al. |
| 10,333,503 B1 | 6/2019 | Cohen et al. |
| 10,454,459 B1 | 10/2019 | Cohen |
| 10,496,069 B2 | 12/2019 | Nazarathy et al. |
| 10,505,524 B1 | 12/2019 | Cohen |
| 10,560,076 B1 | 2/2020 | Cohen |
| 10,637,449 B1 | 4/2020 | Cohen et al. |
| 10,659,018 B1 | 5/2020 | Cohen |
| 10,666,238 B1 | 5/2020 | Cohen |
| 10,958,253 B1 | 3/2021 | Cohen et al. |
| 10,985,739 B2 | 4/2021 | Cohen et al. |
| 11,010,145 B1 | 5/2021 | Smith et al. |
| 11,463,075 B2 | 10/2022 | Cohen et al. |
| 11,616,497 B2 | 3/2023 | Cohen et al. |
| 11,616,498 B2 | 3/2023 | Cohen et al. |
| 2002/0004876 A1 | 1/2002 | Timmer et al. |
| 2004/0266084 A1 | 12/2004 | Fujishima et al. |
| 2005/0015422 A1 | 1/2005 | Kohn et al. |
| 2005/0180575 A1 | 8/2005 | Maeda et al. |
| 2006/0093376 A1 | 5/2006 | Mitchell et al. |
| 2008/0037693 A1 | 2/2008 | Andrus et al. |
| 2009/0268901 A1 | 10/2009 | Lodewyck et al. |
| 2010/0072979 A1 | 3/2010 | Fefer et al. |
| 2011/0035511 A1 | 2/2011 | Biederman |
| 2013/0198499 A1 | 8/2013 | Dice et al. |
| 2016/0125311 A1 | 5/2016 | Fuechsle et al. |
| 2016/0267032 A1 | 9/2016 | Rigetti et al. |
| 2016/0292586 A1 | 10/2016 | Rigetti et al. |
| 2017/0094618 A1 | 3/2017 | Bjorkengren |
| 2017/0214410 A1 | 7/2017 | Hincks et al. |
| 2017/0364796 A1 | 12/2017 | Wiebe |
| 2018/0013426 A1 | 1/2018 | Deurloo et al. |
| 2018/0032893 A1 | 2/2018 | Epstein |
| 2018/0091244 A1 | 3/2018 | Abdo |
| 2018/0107579 A1 | 4/2018 | Chapman |
| 2018/0123597 A1 | 5/2018 | Sete |
| 2018/0237039 A1 | 8/2018 | Mong et al. |
| 2018/0260245 A1 | 9/2018 | Smith |
| 2018/0260730 A1 | 9/2018 | Reagor |
| 2018/0260732 A1 | 9/2018 | Bloom |
| 2018/0308007 A1 | 10/2018 | Amin |
| 2018/0322409 A1 | 11/2018 | Barends |
| 2018/0365585 A1 | 12/2018 | Smith |
| 2018/0373995 A1 | 12/2018 | Tomaru et al. |
| 2018/0375650 A1 | 12/2018 | Legre |
| 2019/0042964 A1 | 2/2019 | Elsherbini et al. |
| 2019/0042965 A1 | 2/2019 | Clarke |
| 2019/0042970 A1 | 2/2019 | Zou |
| 2019/0042971 A1 | 2/2019 | Zou |
| 2019/0042972 A1 | 2/2019 | Zou |
| 2019/0042973 A1 | 2/2019 | Zou |
| 2019/0049495 A1 | 2/2019 | Ofek |
| 2019/0251478 A1 | 8/2019 | Bishop et al. |
| 2019/0266512 A1 | 8/2019 | Shen et al. |
| 2019/0302832 A1 | 10/2019 | Morgan et al. |
| 2019/0317589 A1 | 10/2019 | Mathur et al. |
| 2019/0385088 A1 | 12/2019 | Naaman et al. |
| 2020/0293080 A1 | 9/2020 | Poon et al. |
| 2020/0364602 A1 | 11/2020 | Niu et al. |
| 2021/0004707 A1 | 1/2021 | Gambetta et al. |
| 2021/0103847 A1 | 4/2021 | Akzam |
| 2021/0125096 A1 | 4/2021 | Puri et al. |
| 2021/0359670 A1 | 11/2021 | Cohen et al. |

FOREIGN PATENT DOCUMENTS

| | | |
|---|---|---|
| CN | 104467843 | 3/2015 |
| CN | 105281886 A | 1/2016 |
| CN | 105912070 A | 8/2016 |
| CN | 107408223 A | 11/2017 |
| CN | 108111306 A | 6/2018 |
| CN | 108594214 A | 9/2018 |
| CN | 108698815 A | 10/2018 |
| CN | 109165744 A | 1/2019 |
| CN | 110085094 A | 8/2019 |
| CN | 108780129 A | 11/2019 |
| CN | 110677210 | 1/2020 |
| CN | 111464154 | 7/2020 |
| CN | 111767055 A | 10/2020 |
| CN | 112019193 | 12/2020 |
| CN | 112149832 A | 12/2020 |
| EP | 0388052 | 9/1990 |
| JP | 2007049009 A | 2/2007 |
| JP | 2011175078 | 9/2011 |
| JP | 2012188875 | 10/2012 |
| JP | 2018137739 A | 8/2018 |
| WO | 2015178991 A2 | 11/2015 |
| WO | 2015178992 A2 | 11/2015 |
| WO | 2017/078735 | 5/2017 |
| WO | 2017078735 A1 | 5/2017 |
| WO | 2017123940 | 7/2017 |
| WO | 2017139683 A1 | 8/2017 |
| WO | 2018055607 | 3/2018 |
| WO | 2018062991 A1 | 4/2018 |
| WO | 2019063117 A1 | 4/2019 |
| WO | 2020033807 A1 | 2/2020 |
| WO | 2020231795 A1 | 11/2020 |
| WO | 2021/123903 | 6/2021 |

OTHER PUBLICATIONS

Int'l Search Report and Written Opinion Appln No. PCT/IB2019/001410 mailed Jun. 10, 2020.

Int'l Search Report and Written Opinion Appln No. PCT/IB2019/001394 mailed Jun. 17, 2020.

Zhang J, Hegde SS, Suter D. Pulse sequences for controlled 2-and 3-qubit gates in a hybrid quantum register. arXiv preprint arXiv:1806.08408. Jun. 21, 2018.

Wang CY, Kuznetsova L, Gkortsas VM, Diehl L, Kaertner FX, Belkin MA, Belyanin A, Li X, Ham D, Schneider H, Grant P. Mode-locked pulses from mid-infrared quantum cascade lasers. Optics Express. Jul. 20, 2009;17(15):12929-43.

Int'l Search Report and Written Opinion Appln No. PCT/IB2020/000218 mailed Aug. 11, 2020.

Quan R, Zhai Y, Wang M, Hou F, Wang S, Xiang X, Liu T, Zhang S, Dong R. Demonstration of quantum synchronization based on second-order quantum coherence of entangled photons. Scientific reports. Jul. 25, 2016;6:30453. Jul. 25, 2016 (Jul. 25, 2016).

Int'l Search Report and Written Opinion Appln No. PCT/IB2020/000376 mailed Sep. 17, 2020.

Breitfelder et al. eds., IEEE 100: The Authoritative Dictionary of IEEE Standards Terms 1247, definition 2 of "variable" (7th ed. 2000). (Year: 2000).

Int'l Search Report and Written Opinion Appln No. PCT/IB2020/000707 mailed Jan. 12, 2021.

National Academies of Sciences, Engineering, and Medicine. "Quantum Computing: Progress and Prospects". eprint (Dec. 2018) [online]. [retrieved on Jan. 7, 2020]. retrieved from: <https://doi.org/10.17226/25196.> Dec. 4, 2018 (Dec. 4, 2018) pp. 114, 142, 210, Fig. 2.5, Qiskit Backend Specifications at footnote 57: section 4.2, 5.1.5, Fig. 3, Fig. 4 , pp. 30, 57.

IBM Research. "Qiskit Backend Specifications for OpenQASM and OpenPulse Experiments". eprint arXiv:1809.03452v1 (Sep. 10, 2018) [online]. [retrieved on Jan. 7, 2020]. retrieved from: <https://arxiv.org/pdf/1809.03452.pdf> Sep. 10, 2018 (Sep. 10, 2018) section 4.2, 5.1.5, Fig. 3, Fig. 4 , pp. 30, 57.

Int'l Search Report and Written Opinion Appln No. PCT/IB2020/000704 mailed Jan. 17, 2021.

(56) References Cited

OTHER PUBLICATIONS

Wolfowicz, et al. Pulse Techniques for Quantum Information Processing University of Chicago, University College London, eMagRes, 2016, vol. 5: 1515-1528. DOI 10.1002/9780470034590. emrstm1521.

Int'l Search Report and Written Opinion Appln No. PCT/IB2020/000555 mailed Dec. 27, 2020.

Int'l Search Report and Written Opinion Appln No. PCT/IB2020/000760 mailed Jan. 27, 2021.

"Quantum-classical interface based on single flux quantum digital logic". In: Quantum Science and Technology 3.2 (2018), pp. 1-16. DOI: 10.1088/2058-9565/aaa3a0.(retrieved on Jan. 20, 2021). Retrieved from the Internet: <https://arxiv.org/pdf/1710.04645.pdf> McDermott R. et al. Oct. 12, 2017 (Oct. 12, 2017) Section VI, VII, VIII.

European Office Communication with extended Search Report Appln No. 20845965.1 dated Jun. 29, 2023.

European Office Communication with extended Search Report Appln No. 20861242.4 dated Jul. 7, 2023.

European Office Communication with extended Search Report Appln No. 23153085.8 dated Jul. 3, 2023.

Yang Yet al: "FPGA-based electronic system for the control and readout of superconducting qubit systems", arxiv.org, Cornell University Library, 201 Yang Yet al: "FPGA-based electronic system for the control and readout of superconducting qubit systems", arxiv.org, Cornell University Library, 201 Olin Library Cornell University Ithaca, NY 14853, Oct. 15, 2021 (Oct. 15, 2021), XP091078848.

Gebauer Richard et al: "A modular RFSoC-based approach to interface superconducting quantum bits", 2021 International Conference on Field-Programmable Technology (ICFPT), IEEE, Dec. 6, 2021 (Dec. 6, 2021), pp. 1-9, XP034028257, DOI: 10.1109/ICFPT52863.2021.9609909 [retrieved on Nov. 8, 2021].

European Office Communication with extended Search Report Appln No. 20861100.4 dated Jul. 21, 2023.

Fu et al. "eQASM: An Executable Quantum 1-15 Instruction Set Architecture", 2019 IEEE International Symposium on High Performance Computer Architecture (HPCA), IEEE Feb. 16, 2019 (Feb. 16, 2019), pp. 224-237, XP033532496, DOI: 10.1109/HPCA.2019.00040 Retrieved from the Internet: URL: https://ieeexplore.ieee.org/abstract/document/8675197/authors#authors [retrieved on Mar. 26, 2019].

Yunong Shi et al: "Optimized Compilation of Aggregated Instructions for Realistic Quantum Computers", arxiv.org, Cornell University Library, 201 Olin Library Cornell University Ithaca, NY 14853, Feb. 4, 2019 (Feb. 4, 2019), XP081025321, DOI: 10.1145/3297858.3304018.

Chinese Patent Office Action Appln No. 2019800888907 with search report dated Jul. 28, 2023 with translation.

European Office Communication with extended Search Report Appln No. 20869503.1 dated Sep. 12, 2023.

Chinese Patent Office Action Appln No. 2019800902340 with search report dated Aug. 30, 2023 with translation.

Int'l Preliminary Report on Patentability Appln No. PCT/IB2022/050190 mailed Oct. 19, 2023.

Int'l Preliminary Report on Patentability Appln No. PCT/IB2022/000068 mailed Nov. 23, 2023.

Int'l Preliminary Report on Patentability Appln No. PCT/IB2022/000059 mailed Nov. 23, 2023.

Int'l Preliminary Report on Patentability Appln No. PCT/IB2022/000024 mailed Nov. 9, 2023.

Lavoie et al., "A Formalization for Specifying and Implementing Correct Pull-Stream Modules," in arXiv preprint arXiv:1801.06144 (2018). (Year: 2018).

Fu et al., "A Microarchitecture for a Superconducting Quantum Processor," in 38.3 IEEE Micro 40-47 (2018). (Year: 2018).

Chinese Office Action Appln No. 2019800888907 dated Nov. 17, 2023.

European Office Communication with extended Search Report Appln No. 20902662.4.6 dated Dec. 21, 2023.

Int'l Preliminary Report on Patentability Appln No. PCT/IB2022/054903 mailed Dec. 28, 2023.

Int'l Preliminary Report on Patentability Appln No. PCT/IB2022/053304 mailed Feb. 1, 2024.

Int'l Search Report and Written Opinion Appln No. PCT/IB2022/000059 mailed Jul. 7, 2022.

Moreira, "QuTech Central Controller: A Quantum Control Architecture for a Surface-17 Logical Qubit." Delft University of Technology Student Theses Collection (2019). Available at the following URL: http://resolver.tudelft.nl/uuid:502ed5e5-87f7-42bd-a077-c24b7281cd94 May 10, 2019 (May 10, 2019).

Int'l Preliminary Report on Patentability Appln No. PCT/IB2020/001004 mailed Jun. 30, 2022.

Int'l Search Report and Written Opinion Appln No. PCT/IB2022/000024 mailed Jul. 18, 2022.

Baier, Simon, Matteo Pompili, Sophie LN Hermans, Hans KC Beukers, Peter C. Humphreys, Raymond N. Schouten, Raymond FL Vermeulen et al. "Realization of a Multi-Node Quantum Network of Remote Solid-State Qubits", Science, vol. 372, pp. 259-264 (2021) Baier Simon Apr. 16, 2021 (Apr. 16, 2021).

Int'l Search Report and Written Opinion Appln No. PCT/IB2022/000068 mailed Jul. 17, 2022.

D. Copsey et al., "Toward a scalable, silicon-based quantum computing architecture," in IEEE Journal of Selected Topics in Quantum Electronics, vol. 9, No. 6, pp. 1552-1569, Nov.-Dec. 2003, doi: 10.1109/JSTQE.2003.820922. Dec. 31, 2003 (Dec. 31, 2003).

Extended European Search Report Appln No. 19889443.8 dated Aug. 4, 2022.

Int'l Search Report and Written Opinion Appln No. PCT/IB2022/054903 mailed Sep. 8, 2022.

Int'l Preliminary Report on Patentability Appln No. PCT/IB2021/000067 mailed Sep. 22, 2022.

Int'l Search Report and Written Opinion Appln No. PCT/IB2022/053304 mailed Oct. 6, 2022.

Serrano, Javier, M. Lipinski, T. Wlostowski, E. Gousiou, Erik van der Bij, M. Cattin, and G. Daniluk. "The white rabbit project." (2013) Sep. 19, 2013 (Sep. 19, 2013) Entire document.

Extended European Search Report Appln No. 19910800.2 dated Oct. 6, 2022.

Hornibrook J Met al: "Cryogenic Control Architecture for Large-Scale Quantum Computing", arxiv.org, Cornell University Library, 201 Olin Library Cornell University Ithaca, NY 14853, Sep. 8, 2014 (Sep. 8, 2014), XP081391509.

Fu X et al: "An Experimental Microarchitecture for a Superconducting Quantum Processor", MICRO-50 '17: Proceedings of the 50th Annual IEEE/ACM International Symposium on Microarchitecture, Cornell University Library, 201 Olin Library Cornell University Ithaca, NY 14853, Oct. 14, 2017 (Oct. 14, 2017), pp. 1-13, XP081291220.

Zopes J. et al: "High resolution quantum sensing with shaped control pulses", arxiv.org, Cornell University Library, 201 Olin Library Cornell University Ithaca, NY 14853, May 22, 2017 (May 22, 2017), XP081276850.

Cross et al. "Open Quantum Assembly Language", Jan. 10, 2017.

European Office Communication with extended Search Report Appln No. 20766036.6 dated Nov. 24, 2022.

Japanese Patent Office Action Appln No. 2021-529723 dated Oct. 26, 2022 with translation.

Int'l Search Report and Written Opinion Appln No. PCT/IB2020/001004 mailed May 13, 2021.

Int'l Preliminary Report on Patentability Appln No. PCT/IB2019/001410 mailed Jun. 10, 2021.

Int'l Search Report and Written Opinion Appln No. PCT/IB2021/000067 mailed Jun. 21, 2021.

Int'l Preliminary Report on Patentability Appln No. PCT/IB2019/001394 mailed Jul. 29, 2021.

Roffe, J., Quantum Error Correction: An Introductory Guide, Dept. of Physics & Astronomy, Univ. of Sheffeld, UK, Oct. 10, 2019, pp. 1-29.

Int'l Preliminary Report on Patentability Appln No. PCT/IB2020/000218 mailed Sep. 16, 2021.

Int'l Preliminary Report on Patentability Appln No. PCT/IB2020/000376 mailed Nov. 12, 2021.

(56) References Cited

OTHER PUBLICATIONS

Int'l Search Report and Written Opinion Appln No. PCT/IB2021/056254 mailed Dec. 1, 2021.

Ribeiro, Diogo C., Pedro M. Cruz, and Nuno Borges Carvalho, "Towards a denser frequency grid in phase measurements using mixer-based receivers." 2015 85th Microwave Measurement Conference (ARFTG). IEEE, 2015. Dec. 31, 2015 (Dec. 31, 2015).

Int'l Preliminary Report on Patentability Appln No. PCT/IB2020/000555 mailed Feb. 10, 2022.

Int'l Preliminary Report on Patentability Appln No. PCT/IB2020/000707 mailed Mar. 17, 2022.

Int'l Preliminary Report on Patentability Appln No. PCT/IB2020/000704 mailed Mar. 17, 2022.

Int'l Preliminary Report on Patentability Appln No. PCT/IB2020/000760 mailed Apr. 7, 2022.

Int'l Search Report and Written Opinion Appln No. PCT/IB2022/050190 mailed Apr. 11, 2022.

SYSTEM AND METHOD FOR PULSE GENERATION DURING QUANTUM OPERATIONS

CROSS-REFERENCE TO RELATED APPLICATIONS

Co-pending application Ser. No. 17/020,135, filed Sep. 14, 2020 is incorporated herein by reference in its entirety.

BACKGROUND

Limitations and disadvantages of conventional quantum controllers will become apparent to one of skill in the art, through comparison of such approaches with some aspects of the present method and system set forth in the remainder of this disclosure with reference to the drawings.

BRIEF SUMMARY

Methods and systems are provided for pulse generation in a quantum controller, substantially as illustrated by and/or described in connection with at least one of the figures, as set forth more completely in the claims.

DETAILED DESCRIPTION

Classical computers operate by storing information in the form of binary digits ("bits") and processing those bits via binary logic gates. At any given time, each bit takes on only one of two discrete values: 0 (or "off") and 1 (or "on"). The logical operations performed by the binary logic gates are defined by Boolean algebra and circuit behavior is governed by classical physics. In a modern classical system, the circuits for storing the bits and realizing the logical operations are usually made from electrical wires that can carry two different voltages, representing the 0 and 1 of the bit, and transistor-based logic gates that perform the Boolean logic operations.

Logical operations in classical computers are performed on fixed states. For example, at time 0 a bit is in a first state, at time 1 a logic operation is applied to the bit, and at time 2 the bit is in a second state as determined by the state at time 0 and the logic operation. The state of a bit is typically stored as a voltage (e.g., 1 $V_{dc}$ for a "1" or 0 $V_{dc}$ for a "0"). The logic operation typically comprises of one or more transistors.

Obviously, a classical computer with a single bit and single logic gate is of limited use, which is why modern classical computers with even modest computation power contain billions of bits and transistors. That is to say, classical computers that can solve increasingly complex problems inevitably require increasingly large numbers of bits and transistors and/or increasingly long amounts of time for carrying out the algorithms. There are, however, some problems which would require an infeasibly large number of transistors and/or infeasibly long amount of time to arrive at a solution. Such problems are referred to as intractable.

Quantum computers operate by storing information in the form of quantum bits ("qubits") and processing those qubits via quantum gates. Unlike a bit which can only be in one state (either 0 or 1) at any given time, a qubit can be in a superposition of the two states at the same time. More precisely, a quantum bit is a system whose state lives in a two dimensional Hilbert space and is therefore described as a linear combination $\alpha|0\rangle + \beta|1\rangle$, where $|0\rangle$ and $|1\rangle$ are two basis states, and $\alpha$ and $\beta$ are complex numbers, usually called probability amplitudes, which satisfy $|\alpha|^2+|\beta|^2=1$. Using this notation, when the qubit is measured, it will be 0 with probability $|\alpha|^2$ and will be 1 with probability $|\beta|^2$. The basis states $|0\rangle$ and $|1\rangle$ can also be represented by two-dimensional basis vectors $$\begin{bmatrix}1\\0\end{bmatrix} \text{ and } \begin{bmatrix}0\\1\end{bmatrix},$$

respectively. The qubit state may represented by $$\begin{bmatrix}\alpha\\\beta\end{bmatrix}.$$

The operations performed by the quantum gates are defined by linear algebra over Hilbert space and circuit behavior is governed by quantum physics. This extra richness in the mathematical behavior of qubits and the operations on them, enables quantum computers to solve some problems much faster than classical computers. In fact, some problems that are intractable for classical computers may become trivial for quantum computers.

Unlike a classical bit, a qubit cannot be stored as a single voltage value on a wire. Instead, a qubit is physically realized using a two-level quantum mechanical system. For example, at time 0 a qubit is described as $$\begin{bmatrix}\alpha_1\\\beta_1\end{bmatrix},$$

at time 1 a logic operation is applied to the qubit, and at time 2 the qubit is described as $$\begin{bmatrix}\alpha_2\\\beta_2\end{bmatrix}.$$

Many physical implementations of qubits have been proposed and developed over the years. Some examples of qubits implementations include superconducting circuits, spin qubits, and trapped ions.

A quantum orchestration platform (QOP) may comprise a quantum controller (QC), a quantum programming subsystem and a quantum processor.

It is the job of a QC to generate the precise series of external signals, usually pulses of electromagnetic waves and pulses of base band voltage, to perform the desired logic operations (and thus carry out the desired quantum algorithm).

The quantum programming subsystem comprises circuitry operable to generate a quantum algorithm description which configures the QC and includes instructions the QC can execute to carry out the quantum algorithm (i.e., generate the necessary outbound quantum control pulse(s)) with little or no human intervention during runtime. In an example implementation, the quantum programming system is a personal computer comprising a processor, memory, and other associated circuitry (e.g., an x86 or x64 chipset). The quantum programming subsystem then compiles the high-level quantum algorithm description to a machine code version of the quantum algorithm description (i.e., series of binary vectors that represent instructions that the QC's hardware can interpret and execute directly).

The quantum programming subsystem may be coupled to the QC via an interconnect which may, for example, utilize a universal serial bus (USB), a peripheral component interconnect (PCIe) bus, wired or wireless Ethernet, or any other suitable communication protocol.

The QC comprises circuitry operable to load the machine code quantum algorithm description from the programming subsystem via the interconnect. Then, execution of the machine code by the QC causes the QC to generate the necessary outbound quantum control pulse(s) that correspond to the desired operations to be performed on the quantum processor (e.g., sent to qubit(s) for manipulating a state of the qubit(s) or to readout resonator(s) for reading the state of the qubit(s), etc.). Depending on the quantum algorithm to be performed, outbound pulse(s) for carrying out the algorithm may be predetermined at design time and/or may need to be determined during runtime. The runtime determination of the pulses may comprise performance of classical calculations and processing in the QC during runtime of the algorithm (e.g., runtime analysis of inbound pulses received from the quantum processor).

During runtime and/or upon completion of a quantum algorithm performed by the QC, the QC may output data/results to the quantum programming subsystem. In an example implementation these results may be used to generate a new quantum algorithm description for a subsequent run of the quantum algorithm and/or update the quantum algorithm description during runtime. Inputs from the quantum programming subsystem may also be pulled to the QC.

A QC comprises a plurality of pulse processors, which may be implemented in a field programmable gate array, an application specific integrated circuit or the like. A pulse processor is operable to generate and control outbound pulses that drive a quantum element (e.g., one or more qubits and/or resonators). A pulse processor is also operable to receive and analyze inbound pulses from a quantum element.

Figure 1:
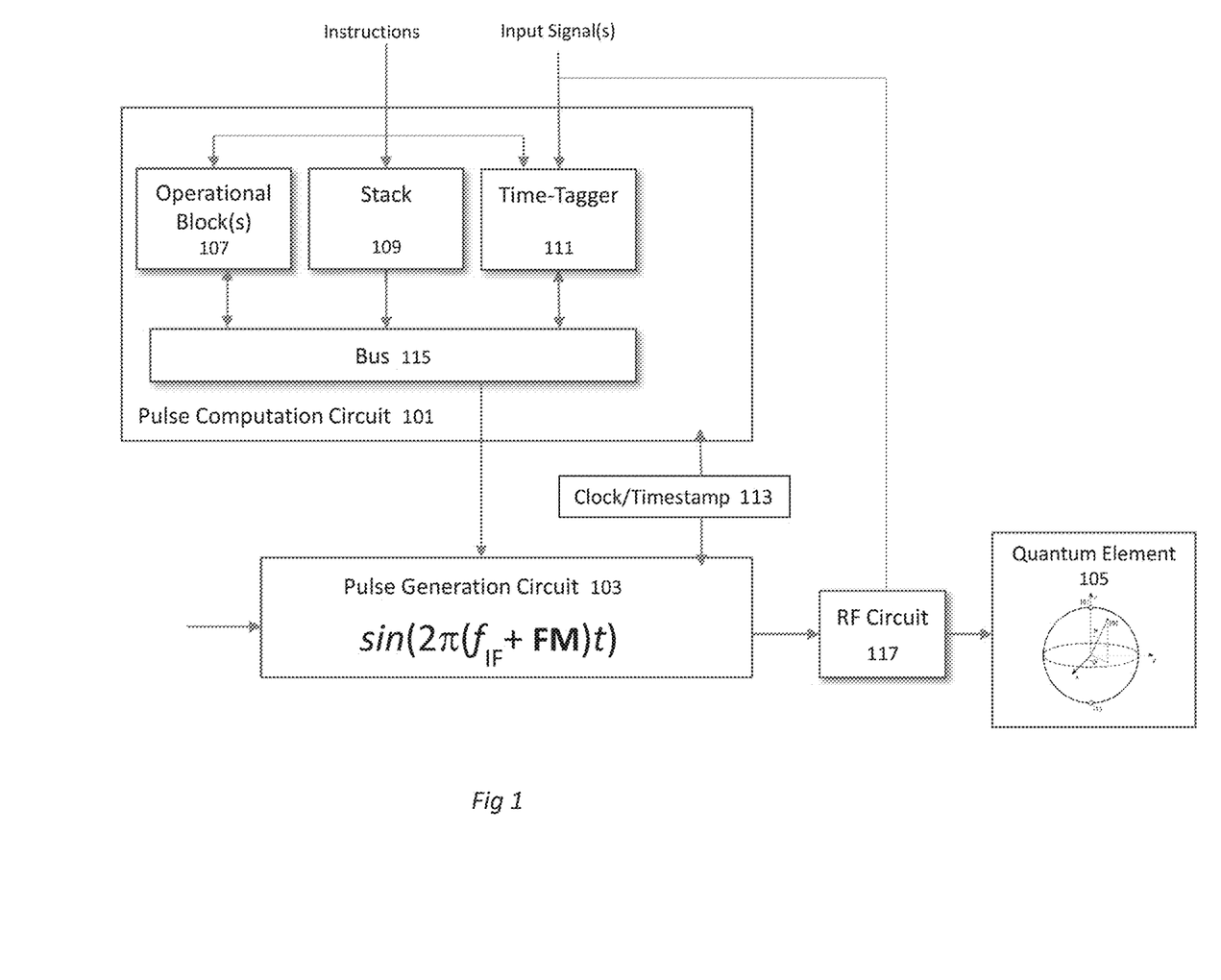
FIG. 1 illustrates an example system for pulse generation and pulse computation during quantum operations in accordance with various example implementations of this disclosure.

FIG. 1 illustrates an example pulse processor system for pulse generation and pulse computation during quantum operations in accordance with various example implementations of this disclosure.

The pulse processor in FIG. 1 comprises a pulse computation circuit 101 and a pulse generation circuit 103. The pulse generation circuit 103 generates an outbound pulse associated with a quantum element operation. The outbound pulse may be a frequency modulated (FM) intermediate frequency (IF) signal of the form $\sin(2\pi(f_{IF}+FM)t)$, where $f_{IF}$ is a selectable IF. The outbound pulse is transmitted to a quantum element 105 via an RF circuit 117.

The pulse computation circuit 101 is operational while the pulse generation circuit 103 generates the outbound pulse. The pulse computation circuit 101 comprises a bus 115 and a plurality of operational blocks 107, 109, 111. The operational blocks 107, 109, 111 of the pulse computation circuit 101 generate results that are routed to the bus 115. The bus 115 is a register level which stores all of the operational block results. The bus vectors are used by the operational blocks 107, 109, 111 for further computation. Results may be dispatched from the bus 115 to various destinations.

One of the operational blocks may be a stack block 109. The stack block 109 is able to select a register vector from the bus 115. The stack block 109 is also able to perform a push, pull or peek operation to determine latency.

The pulse computation circuit 101 and pulse generation circuit 103 maintain time and frequency synchronization using a clock/timestamp 113. The clock/timestamp 113 comprises an internal system clock that maintains the exact same phase within the pulse computation circuit 101 and pulse generation circuit 103. The clock/timestamp 113 also manages a timestamp that holds the same value for both the pulse computation circuit 101 and the pulse generation circuit 103. Operations are synchronized through reading the current timestamp and holding control registers in the bus 115. For example, a phase increment may be multiplied by the timestamp to generate a global phase accumulated. This enables a frequency basis with respect to an absolute t=0, thereby allowing a seamlessly switching between frequencies while keeping a global phase that progresses in a deterministic fashion.

The pulse computation circuit 101 may receive instructions and execute a program to analyze an input signal to determine its characteristics. Such an input signal may be derived from the outbound pulse. For example, the input signal may be a response from a quantum element. The input signal may be a baseband or IF signal downconverted from RF. The input signal may a single channel or may be in a dual channel I/Q format.

Another of the operational blocks is a time-tagger block 111 that is able to associate a timestamp with each sample of the input signal and determine a characteristic of the input signal. For example, the time-tagger block may determine an arrival time of a rising-edge and/or a falling-edge of the input signal. The time-tagger block may also determine the number of zero crossings of the input signal during a period of time.

The pulse generation circuit 103 modifies one or more parameters of the outbound pulse according to the determined characteristics from the pulse computation circuit 101. The determined characteristics may be selectively dispatched from the bus 116 as one or more results.

Figure 2:
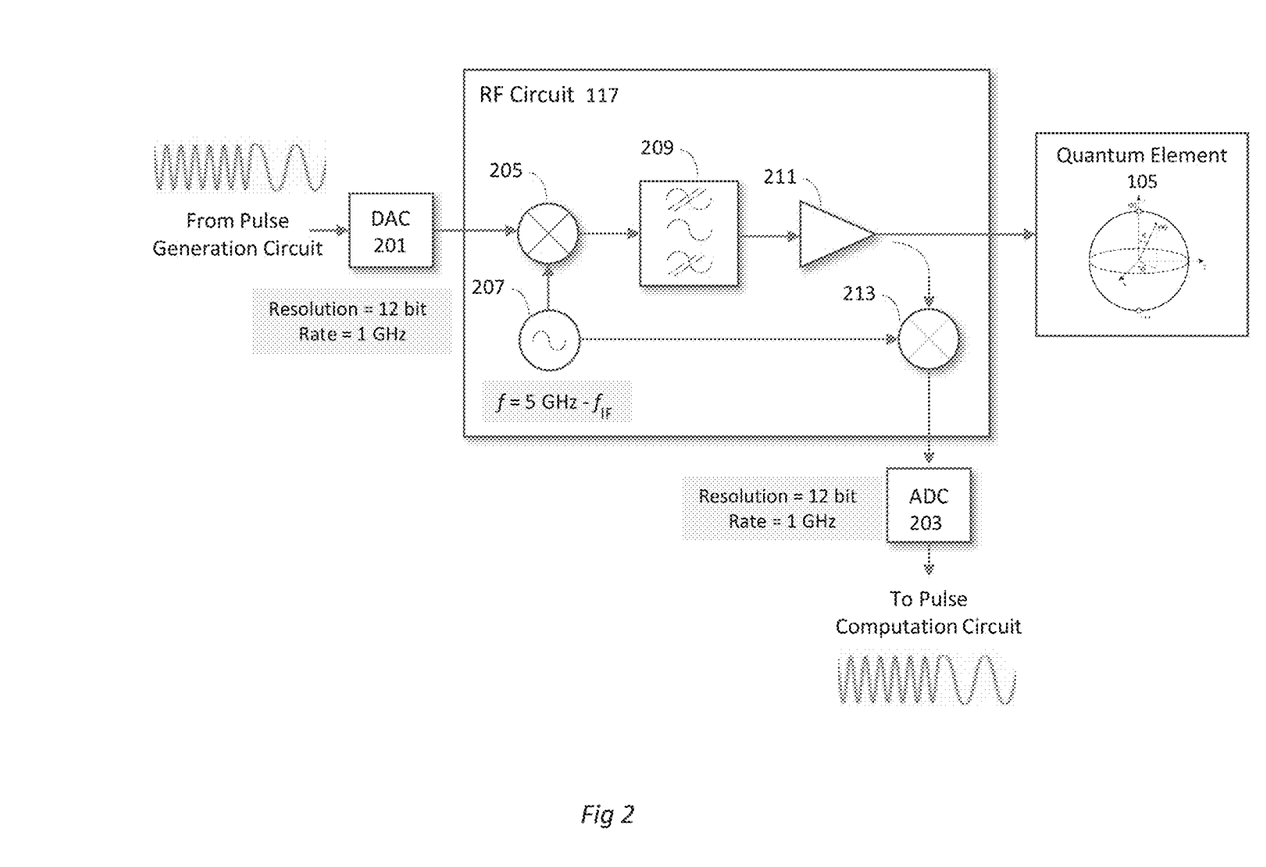
FIG. 2 illustrates an example RF circuit that may be operably coupled to a system for pulse generation during quantum operations in accordance with various example implementations of this disclosure.

FIG. 2 illustrates an example RF circuit 117 that may be operably coupled to a pulse generation circuit 103 (of FIG. 1) during quantum operations in accordance with various example implementations of this disclosure.

The RF circuit 117 comprises a mixer 205, an oscillator 207, a bandpass filter 209 and an amplifier 211. The outbound pulse from pulse generation circuit 103 (of FIG. 1) is converted from digital to analog with DAC 201. For example, the DAC 201 may convert 12 bit digital samples at a rate of 1 GHz. The DAC 201 may comprise a digital interpolator. The interpolation may be, for example, third-order interpolation. The DAC 201 may be located in the pulse generation circuit 103 (of FIG. 1), in the RF circuit 117 or in a stand-alone device. The analog output of the DAC 201 is converted to RF (e.g., ~5 GHz) in mixer 205. The RF signal is filter in bandpass filter 209 and amplified in amplifier 211. The output of the amplifier 211 is used for an operation on quantum element 105.

The operation on quantum element 105 is highly dependent on an exact phase. However, the mixer 205, the oscillator 207, the bandpass filter 209 and the amplifier 211 may introduce a phase perturbation. A feedback to the pulse generation circuit 103 (of FIG. 1) controls such phase perturbations. The RF signal output from the amplifier 211 may be down converted by mixer 213. While mixer 213 is illustrated as being connected to oscillator 207, mixer 213 may also use a slightly higher or lower frequency, such that the IF input to mixer 205 is offset from the IF output from mixer 213. Non-ideal responses caused by the introduction of mixer 213 may be calibrated out prior to system operation. The analog IF output from mixer 213 is sampled by ADC 203. For example, ADC 203 may generate 12 bit digital samples at a rate of 1 GHz. The digital samples are coupled the pulse computation circuit 101 (of FIG. 1). ADC 203 may be located in the pulse computation circuit 101 (of FIG. 1), in the RF circuit 117 or in a stand-alone device.

Figure 3:
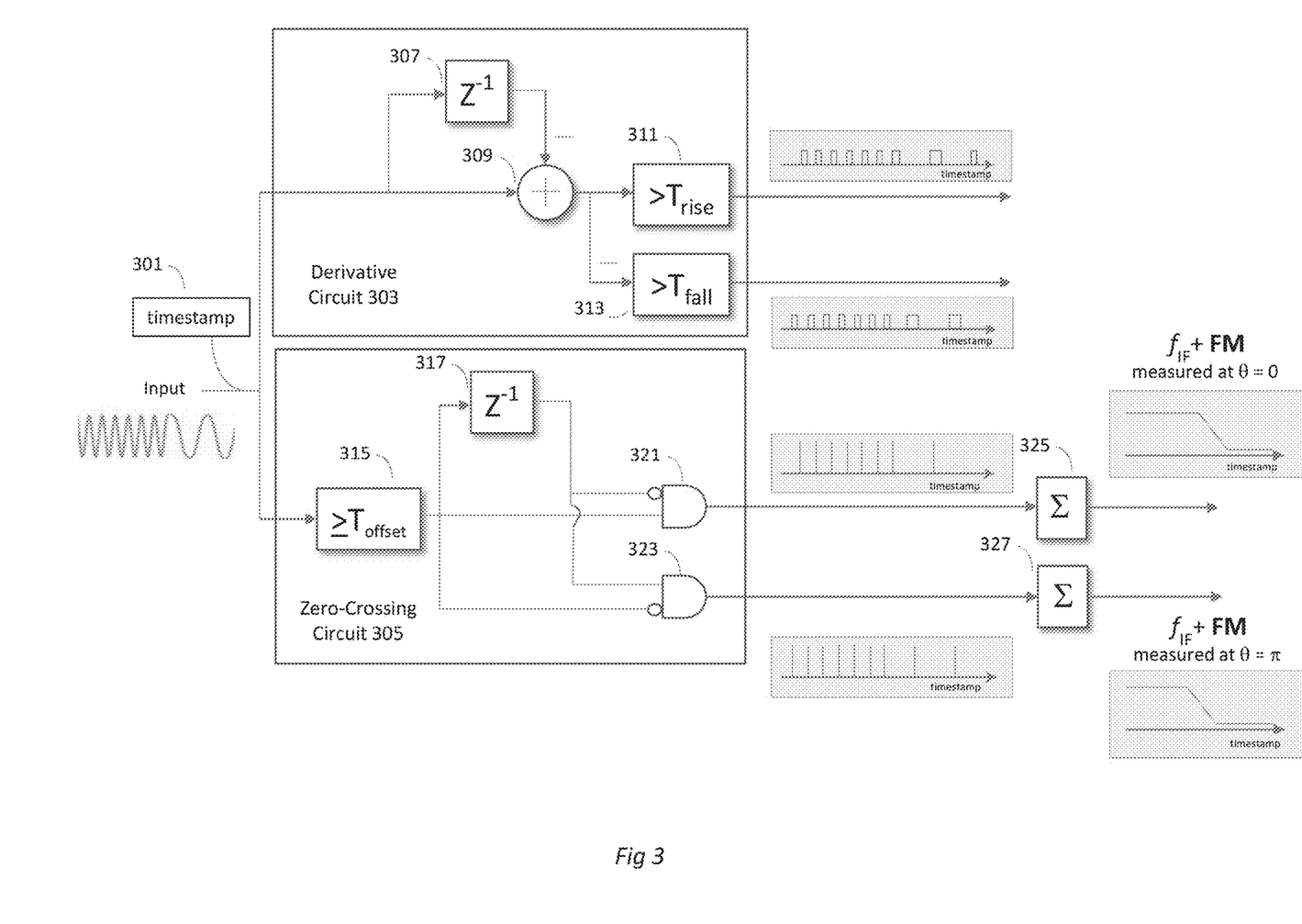
FIG. 3 illustrates an example time-tagger block for use in pulse computation during quantum operations in accordance with various example implementations of this disclosure.

FIG. 3 illustrates an example time-tagger block 111 (of FIG. 1) for use in pulse computation during quantum operations in accordance with various example implementations of this disclosure. The time-tagger block 111 (of FIG. 1) associates a timestamp 301 with each sample of the input signal. The time-tagged samples are analyzed in a derivative circuit 303 and a zero-crossing circuit 305.

The derivative circuit 303 comprises a subtractor 309 for determining an estimate of a derivative of the input signal. A current sample is compared with a previous sample as provided by delay 307. Alternatively the subtractor 309 may operate on a parallel sequence of samples. The subtractor 309 output is then compared to a threshold, $T_{rise}$, 311 to determine whether the derivative is positive (i.e., the input is rising). In some situations, $T_{rise}$ may be set to 0, and the derivative is determined by threshold, $T_{rise}$, 311 to be positive or negative. $T_{rise}$ may also be set above noise floor. In this case, the subtractor 309 output is inverted and compared to a threshold, $T_{fall}$, 313 to determine whether the derivative is negative (i.e., the input is falling). The output results from threshold, $T_{rise}$, 311 and threshold, $T_{fall}$, 313 are sent to bus 111 (in FIG. 1) and are available for further computations. The threshold, $T_{rise}$, 311 output indicates the location of the rising edge of the input signal. The threshold, $T_{fall}$, 313 output indicates the location of the falling-edge of the input signal. A timestamp may be associated with each threshold crossing.

The zero-crossing circuit 305 detects when ADC data crosses a threshold value, $T_{offset}$ at comparator 315. $T_{rise}$, $T_{fall}$ and $T_{offset}$ may be maintained in (and be accessed from) bus 111. $T_{offset}$ may be set to 0 if the input signal is centered at zero. Otherwise, $T_{offset}$ may be set according to a DC bias of the input signal. A current output from comparator 315 is compared with a previous output from comparator 315 as provided by delay 317. A "01" sequence, as indicated at logic gate 321, is a crossing of $T_{offset}$ from a lower value to a higher value. A "10" sequence, as indicated at logic gate 323, is a crossing of $T_{offset}$ from a higher value to a lower value. The output results from logic gate 321 and logic gate 323 are sent to bus 111 (in FIG. 1) and are available for further computations.

The time-tagger block may also determine the number of threshold crossings of the input signal during a selectable period of time. The output of counter/summer 325 is an estimate of $f_{IF}$+ FM as measured at a phase of 0. The output of counter/summer 327 is an estimate of $f_{IF}$+ FM as measured at a phase of π. The output results from counter/summer 325 and counter/summer 327 are sent to bus 111 (in FIG. 1) and are available for further computations. For example, the output results from counter/summer 325 and counter/summer 327 may indicate desired or undesired phase perturbations.

The input signal may be digitally sampled and then also interpolated in order to increase the resolution of the time tagging. The time-tagger block would, therefore, be configured to determine a number of threshold crossings in an interpolated version of the input signal.

Figure 4:
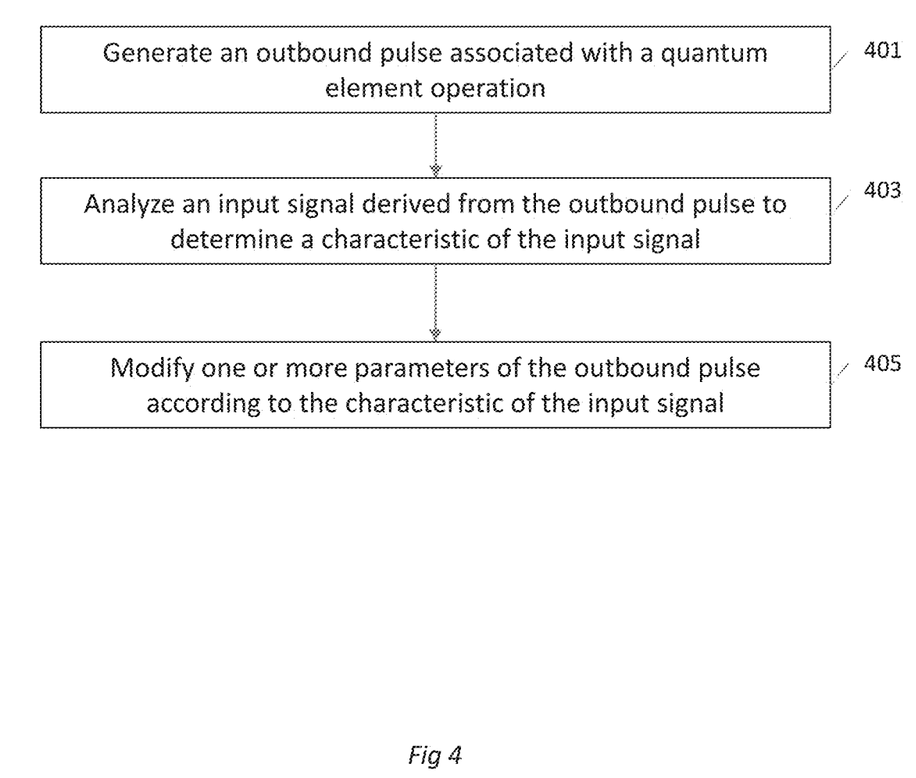
FIG. 4 illustrates a flowchart of an example method for pulse generation and pulse computation during quantum operations in accordance with various example implementations of this disclosure.

FIG. 4 illustrates a flowchart of an example method for pulse generation and pulse computation during quantum operations in accordance with various example implementations of this disclosure.

At step 401, an outbound pulse associated with a quantum element operation is generated in a pulse generation circuit. A pulse computation circuit is operational while the pulse generation circuit generates the outbound pulse. At step 403, the pulse computation circuit executes a program to analyze an input signal to determine its characteristics. The input signal may be derived from the outbound pulse. The pulse computation circuit comprises a plurality of operational blocks and a bus. The one or more operational blocks of the pulse computation circuit generate results that are routed to the bus.

The plurality of operational blocks comprise a time-tagger block that is able to associate a timestamp with each sample of an input signal and determine a characteristic of the input signal. For example, the time-tagger block may determine a rising-edge and/or a falling-edge of the input signal. The time-tagger block may also determine the number of zero crossings of the input signal during a period of time.

At step 405, the pulse generation circuit modifies one or more parameters of the outbound pulse according to the determined characteristics. The determined characteristics may be selectively dispatched from the bus as one or more results.

The plurality of operational blocks may comprise a stack block that is able to select a register vector from the bus. The stack block is also able to perform a push, pull or peek operation to determine latency.

The present method and/or system may be realized in hardware, software, or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical implementation may comprise one or more application specific integrated circuit (ASIC), one or more field programmable gate array (FPGA), and/or one or more processor (e.g., x86, x64, ARM, PIC, and/or any other suitable processor architecture) and associated supporting circuitry (e.g., storage, DRAM, FLASH, bus interface circuits, etc.). Each discrete ASIC, FPGA, Processor, or other circuit may be referred to as "chip," and multiple such circuits may be referred to as a "chipset." Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to perform processes as described in this disclosure. Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to be configured (e.g., to load software and/or firmware into its circuits) to operate as a system described in this disclosure.

As used herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As used herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As used herein, the term "exemplary" means serving as a non-limiting example, instance, or illustration. As used herein, the terms "e.g.," and "for example" set off lists of one or more non-limiting examples, instances, or illustrations. As used herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.). As used herein, the term "based on" means "based at least in part on." For example, "x based on y" means that "x" is based at least in part on "y" (and may also be based on z, for example).

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed is:

1. A system comprising:
   a pulse generation circuit configured to generate an outbound pulse associated with a quantum element operation; and
   a pulse computation circuit comprising a bus and a plurality of operational blocks, wherein:
      the pulse computation circuit is configured to execute a program while the pulse generation circuit generates the outbound pulse,
      the pulse computation circuit is configured to selectively dispatch one or more results from the plurality of operational blocks,
      the pulse generation circuit is operable to modify one or more parameters of the outbound pulse according to the one or more dispatched results, and
      the plurality of operational blocks comprises a time-tagger block configured to determine a number of threshold crossings in an input signal.

2. The system of claim 1, wherein the plurality of operational blocks comprises a time-tagger block configured to determine a characteristic of an input signal.

3. The system of claim 2, wherein the characteristic is an arrival time of a rising-edge of the input signal.

4. The system of claim 2, wherein the characteristic is an arrival time of a falling-edge of the input signal.

5. The system of claim 1, wherein the input signal is digitally sampled and interpolated.

6. The system of claim 1, wherein the time-tagger block is configured to associate a timestamp to each of a plurality of threshold crossings of an input signals.

7. The system of claim 1, wherein the plurality of operational blocks comprises a stack block configured to select a register vector from the bus.

8. The system of claim 1, wherein the plurality of operational blocks comprises a stack block configured to perform a push operation associated with a deterministic latency.

9. The system of claim 1, wherein the plurality of operational blocks comprises a stack block configured to perform a pull operation associated with a deterministic latency.

10. The system of claim 1, wherein the plurality of operational blocks comprises a stack block configured to perform a peek operation associated with a deterministic latency.

11. A method comprising:
    generating, via a pulse generation circuit, an outbound pulse associated with a quantum element operation;
    executing a program in a pulse computation circuit, while the pulse generation circuit generates the outbound pulse, wherein the pulse computation circuit comprises a plurality of operational blocks and a bus, and wherein the plurality of operational blocks comprises a time-tagger block;
    selectively dispatching one or more results from one or more operational blocks of the pulse computation circuit;
    according to the one or more dispatched results, modifying, via the pulse generation circuit, one or more parameters of the outbound pulse; and
    determining, using the time-tagger block, a number of threshold crossings received.

12. The method of claim 11, wherein the plurality of operational blocks comprises a time-tagger block, and wherein the method comprises determining, using the time-tagger block, a characteristic of an input signal.

13. The method of claim 12, wherein the characteristic is an arrival time of a rising-edge of the input signal.

14. The method of claim 12, wherein the characteristic is an arrival time of a falling-edge of the input signal.

15. The system of claim 11, wherein the number of threshold crossings is determined according to an input signal that is digitally sampled and interpolated.

16. The method of claim 11, wherein the plurality of operational blocks comprises a time-tagger block, and wherein the method comprises associating a timestamp to each of a plurality of threshold crossings.

17. The method of claim 11, wherein the plurality of operational blocks comprises a stack block, and wherein the method comprises selecting a register vector from the bus.

18. The method of claim 11, wherein the plurality of operational blocks comprises a stack block, and wherein the method comprises performing a push operation associated with a deterministic latency.

19. The method of claim 11, wherein the plurality of operational blocks comprises a stack block, and wherein the method comprises performing a pull operation associated with a deterministic latency.

20. The method of claim 11, wherein the plurality of operational blocks comprises a stack block, and wherein the method comprises performing a peek operation associated with a deterministic latency.

* * * * *